United States Patent [19]
Liu et al.

[11] Patent Number: 5,298,439
[45] Date of Patent: Mar. 29, 1994

[54] 1/F NOISE REDUCTION IN HETEROJUNCTION BIPOLAR TRANSISTORS

[75] Inventors: William U.-C. Liu, Dallas; Shou-Kong Fan, Richardson, both of Tex.

[73] Assignee: Texas Instruments Incorporated, Dallas, Tex.

[21] Appl. No.: 999,076

[22] Filed: Dec. 31, 1992

Related U.S. Application Data

[63] Continuation-in-part of Ser. No. 913,600, Jul. 13, 1992.

[51] Int. Cl.$^5$ .................................... H01L 21/265
[52] U.S. Cl. .................................... 437/31; 437/126; 437/133; 148/DIG. 72; 148/DIG. 11
[58] Field of Search ............... 437/31, 126, 133, 33, 437/909; 148/DIG. 72, DIG. 10, DIG. 11

[56] References Cited

U.S. PATENT DOCUMENTS

| | | | |
|---|---|---|---|
| 4,889,831 | 12/1989 | Ishii et al. | 437/31 |
| 5,106,766 | 4/1992 | Lunardi et al. | 437/31 |
| 5,171,697 | 12/1992 | Liu et al. | 437/31 |
| 5,208,184 | 5/1993 | Bayraktaroglu | 437/31 |

FOREIGN PATENT DOCUMENTS

| | | | |
|---|---|---|---|
| 0226066 | 9/1988 | Japan | 437/31 |
| 0254728 | 10/1990 | Japan | 437/31 |
| 0205873 | 9/1991 | Japan | 437/31 |
| 0276635 | 12/1991 | Japan | 437/31 |

OTHER PUBLICATIONS

Liu, "Microwave and D.C. Studies of Npn and Pnp AlGaAs/GaAs Heterojunction Bipolar Transistors", doctoral dissertation, Stanford Electronics Lab., Stanford Univ., Stanford, Conn., 1991.

Lee et al., "Effect of Emitter-Base Spacing on the Current Gain of AlGaAs/GaAs Heterojunction Bipolar Transistors", IEEE Electron Device Letters, vol. 10, No. 5, May 1989, pp. 200-202.

*Primary Examiner*—Brian E. Hearn
*Assistant Examiner*—Tuan Nguyen
*Attorney, Agent, or Firm*—Michael K. Skrehot; James C. Kesterson; Richard L. Donaldson

[57] ABSTRACT

A method of making a transistor comprising the steps of providing a structure having a collector layer 3, a base layer 5, and an emitter layer 7, one atop the other, forming a contact 9 on the emitter layer, removing a portion of the emitter layer to leave a relatively thick mesa region 13 with the contact thereon, a surrounding relatively thin ledge region 11 and an exposed portion of the base layer 5 and forming a contact on the exposed portion of the base layer 5. The emitter layer 7 is preferably GaInP, and preferably $Ga_xIn_{1-x}P$, wherein x is in the range of approximately 0.50 to 0.52, and the base 5 is preferably GaAs. The ledge portion 11 has a thickness of about 700 Angstroms.

20 Claims, 4 Drawing Sheets

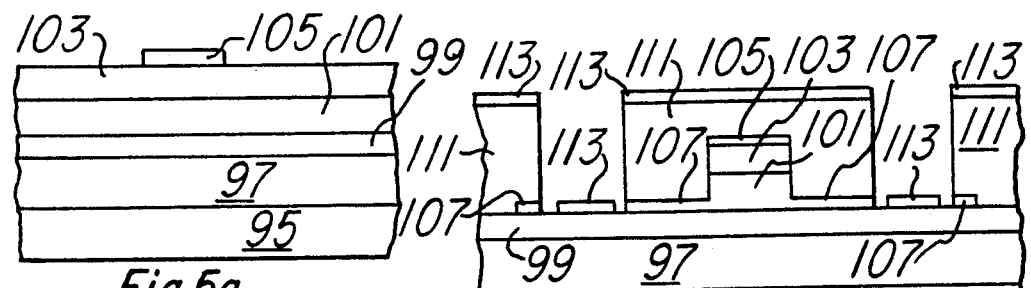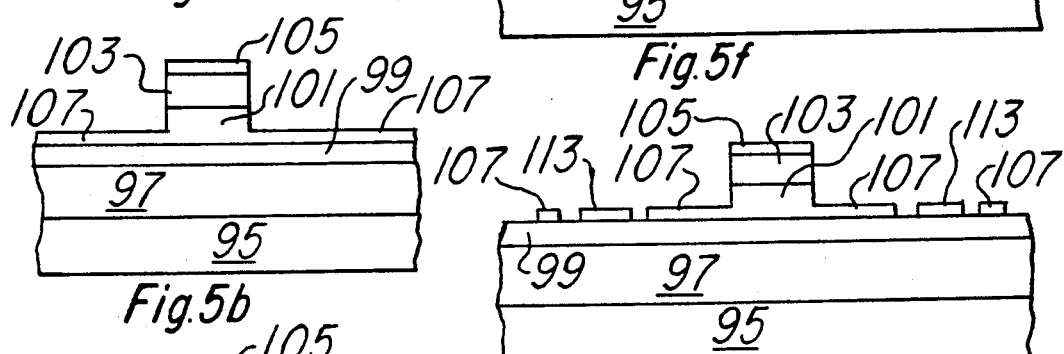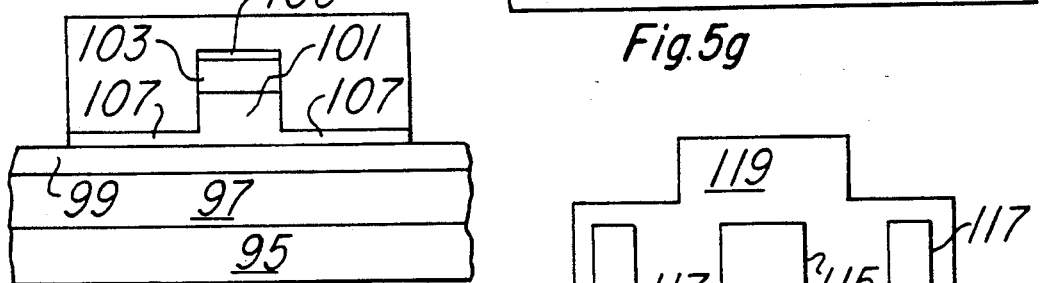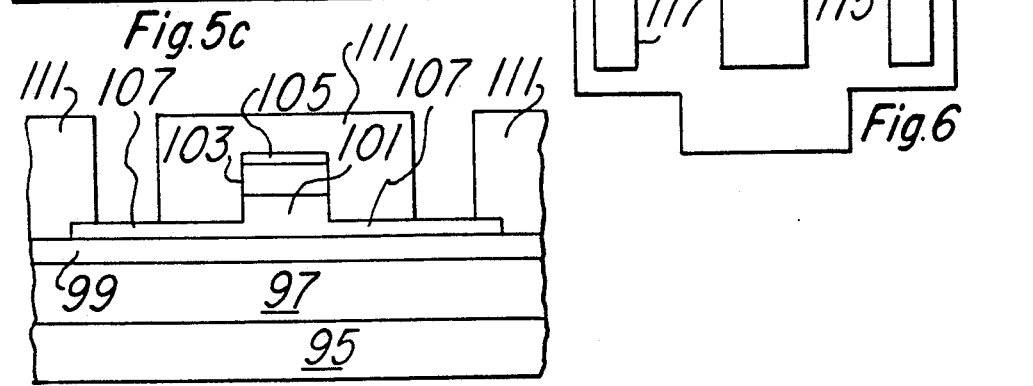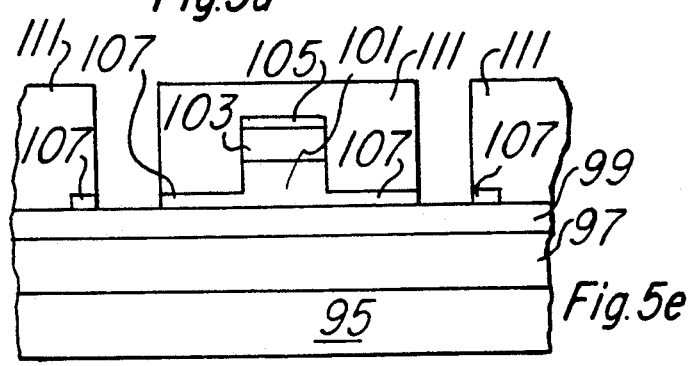

1/F NOISE REDUCTION IN HETEROJUNCTION BIPOLAR TRANSISTORS

This is a continuation-in-part of copending U.S. application Ser. No. 07/913,600 filed on Jul. 13, 1992 by William Uei-Chung Liu and Shou-Kong Fan for an invention entitled 1/f Noise Reduction in Heterojunction Bipolar Transistors.

FIELD OF THE INVENTION

This invention relates to 1/f noise reduction in transistors and, more specifically, to such noise reduction in group III-V heterojunction bipolar transistors.

BACKGROUND OF THE INVENTION

Heterojunction bipolar transistors (HBTs) are generally utilized in power applications as well as in applications that require the active devices to have low 1/f noise and good high frequency performance. Typical examples are low noise oscillation circuits. This choice of utilizing HBTs for low noise applications results because HBTs are vertical devices with minimal exposed surface area, thus suffering less degradation due to surface-related noise sources, contrary to the case of Field Effect Transistors (FETs). While HBTs have consistently demonstrated lower 1/f noise than FET devices, conventional HBTs are still not totally free from surface-related noise sources. In HBTs fabricated with conventional process techniques, the extrinsic base surfaces, which are generally formed of GaAs, are exposed to air. Since a free GaAs surface is characterized by a high surface recombination velocity, significant surface recombination occurs in these extrinsic base surfaces. Fortunately, a surface passivation technique using a depleted AlGaAs layer on top of the extrinsic base can be applied to reduce this surface recombination and this technique has been utilized in the prior art. To date, this surface passivation technique has been limited to the case of using AlGaAs as the emitter material. However, because AlGaAs is known to have substantial DX bulk recombination centers, AlGaAs/GaAs HBTs naturally suffer some degradation in noise performance. DX centers are donor related deep levels in AlGaAs exhibiting unusual and complex properties, such as persistent photoconductivity. DX centers behave as effective electron traps. The current transients caused by the capture and emission of electrons at DX centers constitute noise.

SUMMARY OF THE INVENTION

In accordance with the present invention, a technique is provided to minimize 1/f noise. This is accomplished by using a GaInP/GaAs HBT having a thin GaInP passivation ledge. GaInP has been found to be a better material system that eliminates the presence of DX centers more effectively than does an AlGaAs/GaAs system. The ternary compound GaInP will generally be $Ga_xIn_{1-x}P$, wherein x is in the range of approximately 0.50 to 0.52, when forming a heterojunction with GaAs because it can lattice-match GaAs at this composition. In addition, a thin depletion ledge which is a part of the emitter extends out from the emitter mesa along the surface of the base layer. The purpose of the ledge is to minimize noise from the GaAs layer. GaAs has a very active surface and has many dangling surface states that cause noise and recombination current. The passivation ledge cancels out a large portion of the noise generated at the GaAs layer surface.

Several fabrication procedures are provided to result in a desired ledge configuration which provides the desired improvement in noise performance. This is accomplished, not only because the use of a GaInP emitter eliminates DX centers, but also because the recombination velocity of the $Ga_{0.5}In_{0.5}P$/GaAs interface (1.5 cm/s) is 140 times lower than the $Al_{0.4}Ga_{0.6}As$/GaAs interface (210 cm/s), thus resulting in an even better surface passivation. Several fabrication procedures are described that result in extremely small and tightly toleranced ledge-to-base contact spacing. Minimizing this spacing results in devices with lower extrinsic base resistance and base-collector capacitance, and therefore in devices with higher $f_t$ and $f_{max}$ performance.

Devices in accordance with the present invention will have applications which benefit from the use of low noise devices. These devices can exhibit low noise either at high or low frequencies, depending upon the specific application. For microwave receivers and transmitters, it is desirable at the high operating frequencies to have small signal amplification with as low a noise figure as is technologically possible. In other applications, such as mixers and oscillators, due to unintentional mixings, the low frequency noise can be up-converted as noise sidebands around the microwave carrier signal. Therefore, in these applications, the low frequency noise of the device is also of interest. The present invention reduces the noise sources at the extrinsic base surface and base-emitter junction space charge region of the devices, thus improving the noise performance at both low and high frequencies.

BRIEF DESCRIPTION OF THE DRAWINGS

FIGS. 5a to 5g represent a fifth embodiment of a process flow for fabrication of a HBT in accordance with the present invention; and FIG. 6 represents a top view of some of the masking patterns used in the fifth embodiment process flow.

DETAILED DESCRIPTION OF PREFERRED EMBODIMENTS

Figure 1A:
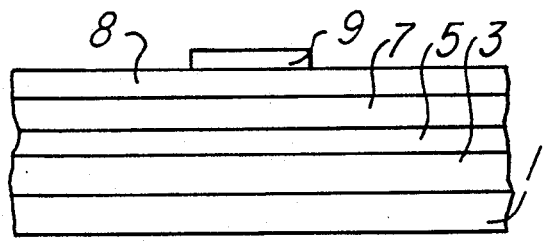
FIGS. 1a to 1d represent a first embodiment of a process flow for fabrication of a HBT in accordance with the present invention.
Figure 2B:
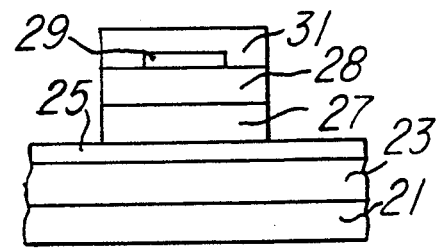
FIGS. 2a to 2f represent a second embodiment of a process flow for fabrication of a HBT in accordance with the present invention.

Referring first to FIGS. 1a to 1d and specifically to FIG. 1a, there is shown a structure which is composed of an n-type GaAs subcollector layer 1 having a doping level of typically about $3 \times 10^{18}$ cm$^{-3}$. A collector layer 3 of n-type GaAs having a doping level of typically about $1 \times 10^{16}$ cm$^{-3}$ is epitaxially formed over the subcollector layer 1. A base layer 5 of p-type GaAs having a doping level of typically about $3 \times 10^{19}$ cm$^{-3}$ to about $5 \times 10^{18}$ cm$^{-3}$ is epitaxially formed over the collector layer 3 and then an emitter layer 7 of n-type GaInP (typically $Ga_xIn_{1-x}P$ wherein x is in the range of approximately 0.50 to 0.52) having a doping level of typically about $3 \times 10^{17}$ cm$^{-3}$ is epitaxially formed over the base layer 5. To facilitate contact, an n-type layer 8, typically GaAs, with typical doping of $\geq 3\times 10^{18}$ cm$^{-3}$ is epitaxially grown on top of the GaInP layer 7. All of the epitaxial layers are formed using standard techniques, such as molecular beam epitaxy (MBE) or metal-organic chemical vapor deposition (MOCVD). The surface of the emitter layer 8 is then patterned with a resist and an emitter metal 9 is formed on a portion of the surface of the emitter 8 as shown in FIG. 1a.

Figure 1B:
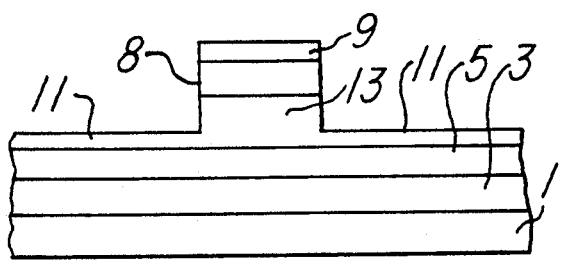

The emitter contact metal 9 acts as a mask for the next step of etching away the cap layer 8 and a portion of the exposed emitter layer 7, leaving a thin portion, about 700 Angstroms, of the emitter layer having a ledge portion 11 and a mesa portion 13 under the emitter metal contact as shown in FIG. 1b. The critical ledge thickness is experimentally shown to range between 200 and 1000 Angstroms. The desired thickness is reached by monitoring the breakdown voltage (snapback voltage), which is measured by placing two probes directly on the freshly etched surface. The breakdown voltage is a sensitive function of the etch position, especially near the emitter-base junction where the doping densities and dopant types on the two sides change drastically. Therefore, the measured breakdown voltages feed back information about the relative etch distance away from the base layer, signaling the desired place to stop further etching.

Figure 1C:
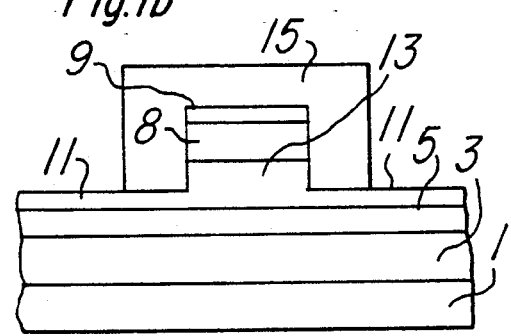
Figure 1D:
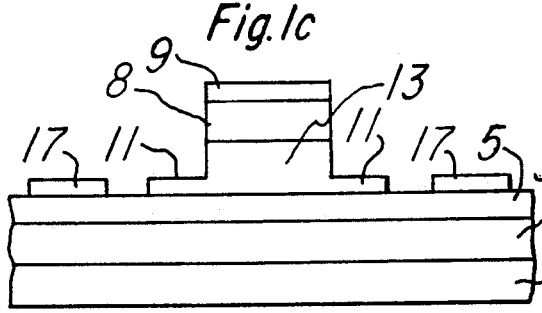

It is now necessary to provide regions on the base layer 5 for contact thereto. This is accomplished by placing a patterned resist layer 15 over the mesa portion of the emitter 13 and part of the thin portion of the emitter 11, leaving a part of the thin portion 11 exposed as shown in FIG. 1c. The exposed portion of the thin portion of the emitter 11 is now etched away in standard manner to reach the base layer 5. The photoresist 15 is then removed and the surface of the device is patterned and base metal contacts 17 are formed on the base and spaced from the remaining ledge portion 11 of the emitter as shown in FIG. 1d.

It can be seen that very little of the surface of the base 5 is exposed due to the extension of the ledge portion 11 of the emitter thereover.

Figure 2C:
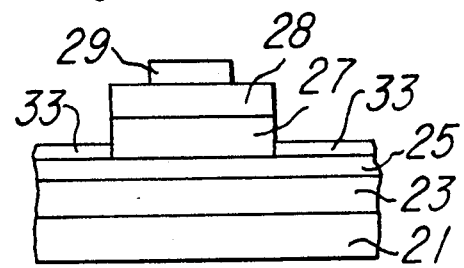
Figure 2D:
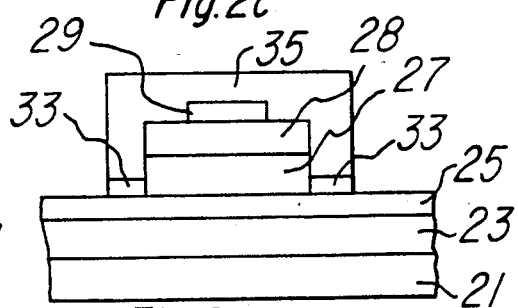
Figure 2E:
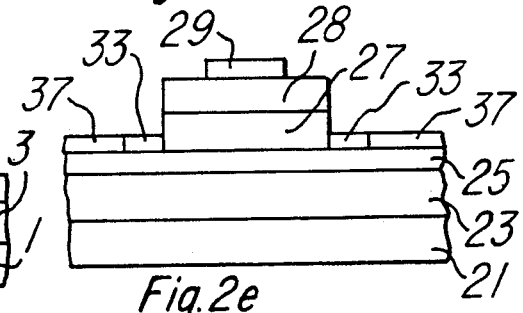
Figure 2A:
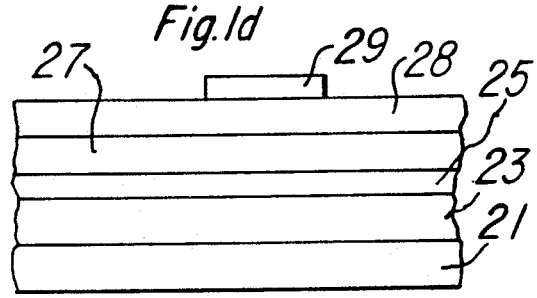

Referring now to FIGS. 2a to 2f and specifically to FIG. 2a, there is shown a structure (as in FIG. 1a) which is composed of an n-type GaAs subcollector layer 21 having a doping level of typically about $3\times 10^{18}$ cm$^{-3}$. A collector layer 23 of n-type GaAs having a doping level of typically about $1\times 10^{16}$ cm$^{-3}$ is epitaxially formed over the subcollector layer 21. A base layer 25 of p-type GaAs having a doping level of typically about $3\times 10^{19}$ cm$^{-3}$ to about $5\times 10^{18}$ cm$^{-3}$ is epitaxially formed over the collector layer 23 and then an emitter layer 27 of n-type GaInP (typically Ga$_x$In$_{1-x}$P wherein x is in the range of approximately 0.50 to 0.52) having a doping level of typically about $3\times 10^{17}$ cm$^{-3}$ is epitaxially formed over the base layer 25. An emitter cap layer 28 of n-type GaAs with typical doping of $\geq 3\times 10^{18}$ cm$^{-3}$ is epitaxially grown over layer 27. All of the epitaxial layers are formed using standard techniques, such as molecular beam epitaxy (MBE) or metal-organic chemical vapor deposition (MOCVD). The surface of the emitter layer 28 is then patterned with a resist and an emitter metal 29 is formed on a portion of the surface of the cap layer 28.

Figure 2F:
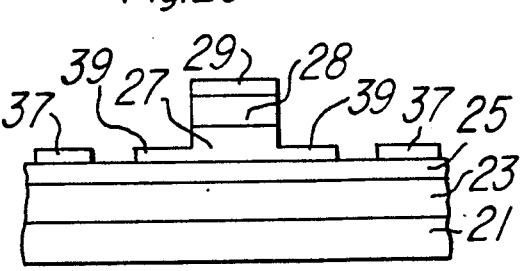

A photoresist layer 31 is patterned over the emitter metal contact 29 and a portion of the emitter 29 extending laterally beyond the contact 29 and the exposed portion of the emitter layer 20 is then etched away in standard manner down to the base layer 25 to expose the base layer. A layer of silicon nitride 33 is then deposited entirely over the wafer. After the lift-off of the photoresist layer 31 and the portion of nitride thereover, only the nitride on the exposed base region remains as shown in FIG. 2c. Photoresist 35 is then patterned over the emitter 27 and emitter contact 29 as well as a portion of the nitride 33 adjacent the emitter 27 and 28 and the exposed nitride is etched away in standard manner as shown in FIG. 2d. The base metal 37 is then deposited in standard manner in the region from which the nitride has been removed to contact the base layer 25 as shown in FIG. 2e. The exposed portion of the emitter 27 is then etched using the metal emitter contact 29 as a mask to form a ledge portion 39 of the emitter as in the prior embodiment and as shown in FIG. 2f. Note that nitride region 33 between the base and emitter contacts in FIG. 2e prevents the portion of the base beneath the nitride region from being etched away. Finally the nitride layer 33 is removed once the ledge 39 is formed. It can again be seen that a substantial portion of the base layer 25 is covered by the ledge 39, leaving a very small portion of the surface of the base layer exposed.

Figure 3A:
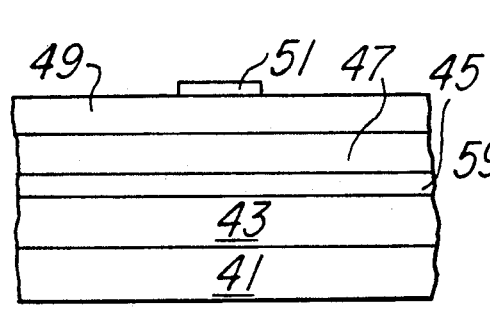
FIGS. 3a to 3h represent a third embodiment of a process flow for fabrication of a HBT in accordance with the present invention.
Figure 3E:
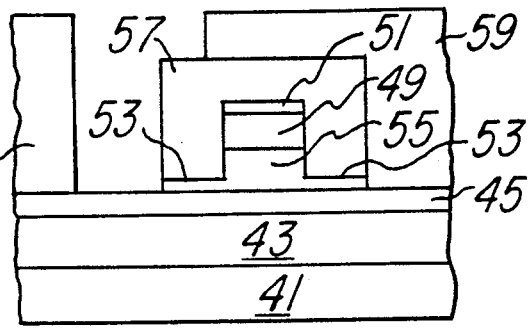
Figure 3B:
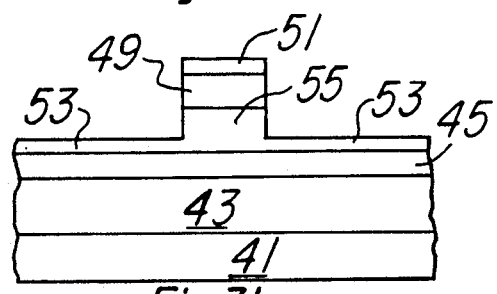

Referring now to FIGS. 3a to 3h and specifically to FIG. 3a, there is shown a structure, as in FIGS. 1a and 2a, which is composed of an n-type GaAs subcollector layer 41 having a doping level of typically about $3\times 10^{18}$ cm$^{-3}$. A collector layer 43 of n-type GaAs having a doping level of typically about $1\times 10^{16}$ cm$^{-3}$ is epitaxially formed over the subcollector layer 41. A base layer 45 of p-type GaAs having a doping level of typically about $3\times 10^{19}$ cm$^{-3}$ to about $5\times 10^{18}$ cm$^{-3}$ is epitaxially formed over the collector layer 43 and then an emitter layer 47 of n-type GaInP (typically Ga$_x$In$_{1-x}$P wherein x is in the range of approximately 0.50 to 0.52) having a doping level of typically about $3\times 10^{17}$ cm$^{-3}$ is epitaxially formed over the base layer 45. An emitter cap layer 49 of n-type GaAs with typical doping of $\geq 3\times 10^{18}$ cm$^{-3}$ is epitaxially grown over layer 47. The emitter cap layer may be composed of InGaAs, which is capable of providing a very low resistance contact. All of the epitaxial layers are formed using standard techniques, such as molecular beam epitaxy (MBE) or metal-organic chemical vapor deposition (MOCVD). The surface of the emitter cap layer 49 is then patterned with a resist and an emitter metal 51 is formed on a portion of the surface of the cap layer 49. The emitter contact metal 51 acts as a mask for the next step of etching away the cap layer 49 and a portion of the exposed emitter layer 47, leaving a thin portion, about 700 Angstroms, of the emitter layer having a ledge portion 53 and a mesa portion 55 under the emitter metal contact as shown in FIG. 3b.

Figure 3F:
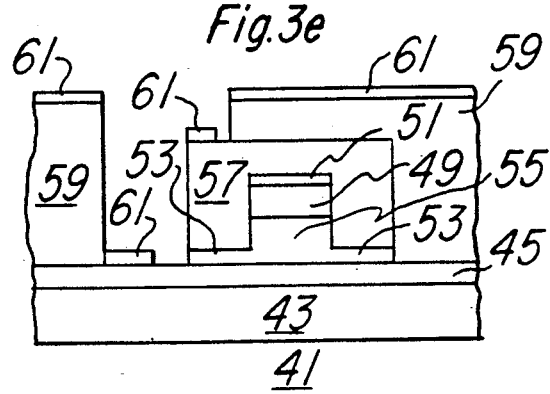
Figure 3C:
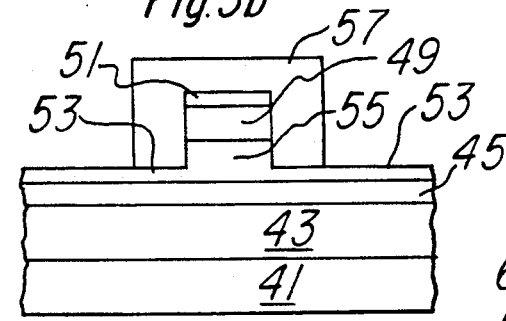
Figure 3G:
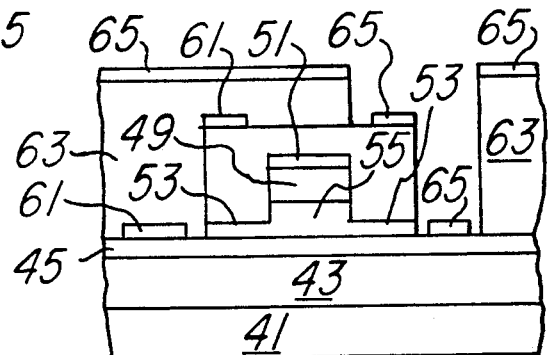
Figure 3D:
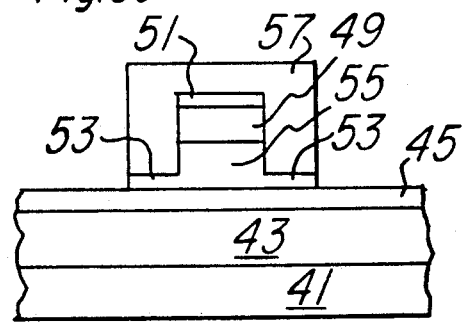
Figure 3H:
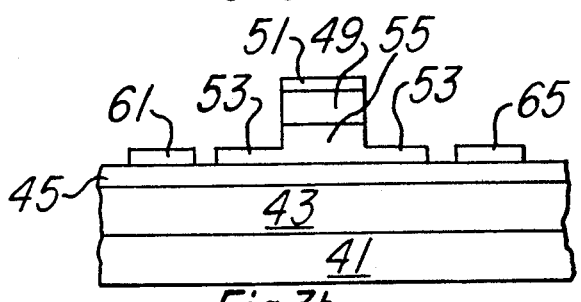

It is now necessary to provide regions on the base layer 45 for contact thereto. This is accomplished by placing a patterned resist layer 57 over the mesa portion of the emitter 55 and part of the thin portion of the emitter 53, leaving a part of the thin portion 53 exposed as shown in FIG. 3c. The exposed portion of the thin portion of the emitter 53 is now etched away in standard manner to reach the base layer 45 as shown in FIG. 3d. The photoresist 57 is then hardened by baking the structure at 150° C. for at least approximately 3 minutes. This hardening of the photoresist 57 is important in preventing it from further photoresist development during the subsequent lithography processes involved in base metallization and liftoff.

A photoresist layer 59 is patterned over the exposed base layer 45 and the hardened photoresist 57 to leave an opening to the base layer 45, as shown in FIG. 3e. Base contact metal 61 is deposited using an angle evaporation technique, as shown in FIG. 3f. Photoresist 59 and excess metallization 61 is then removed. The process is then repeated for another base contact. Photoresist 63 is patterned over the hardened photoresist 57 and the base layer 45. Again, the angle evaporation technique is used to deposit base metallization 65, as shown in FIG. 3g. Photoresist 63 is removed along with excess metallization 65. The hardened photoresist 57 is then removed in a solvent such as J-100 resist stripper. This results in the structure of FIG. 3h. By selecting the combination of photoresist 59 and 63 height and evaporation angle, the spacing between the base contacts 61 and 65 and ledge 53 can be controlled to within an accuracy of about 0.1 $\mu$m. Experiments have shown that the most preferable height of the photoresist 59 and 63 is in the range of approximately 1.0 $\mu$m to 2.0 $\mu$m and that the most preferable angle of evaporation is in the range of approximately 15° to 30°.

Unlike the process described in FIGS. 1a to 1d, this technique minimizes the separation between the edge of the passivation ledge 53 and the base contacts 61 and 65 by eliminating the base contact optical lithography alignment step, and instead using the self-aligned angle evaporation procedure. The process described in FIGS. 1a to 1d can suffer from as much as about 4 $\mu$m of unpassivated base layer between the ledge 11 and base contact 17, whereas the angle evaporation technique can provide much smaller spacings (virtually zero) with tolerances on the order of about 0.1 $\mu$m. This is important because a large ledge-to-base contact spacing can result in increased extrinsic base resistance and base-collector capacitance, both of which degrade device performance.

Several process variations can be derived from the process described above. For example, the hardened photoresist 57 may be replace by a polymer, such as polyimide, or a dielectric, such as a nitride or oxide. An important aspect of this protective layer is that it can be removed after base metallization, but is not affected during the photoresist development portions of the base contact lithography steps. Instead of a hardened photoresist, standard resist may be used by placing a masking metal on top of the photoresist before base patterning. The advantages of using a masking metal include avoiding the hardening of the photoresist and thereby facilitating the final photoresist removal.

Figure 4A:
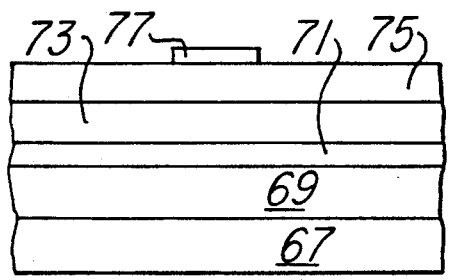
FIGS. 4a to 4g represent a fourth embodiment of a process flow for fabrication of a HBT in accordance with the present invention.
Figure 4B:
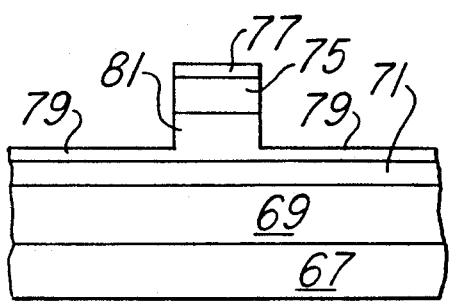
Figure 4C:
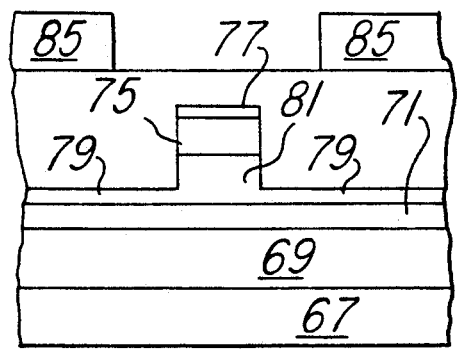
Figure 4D:
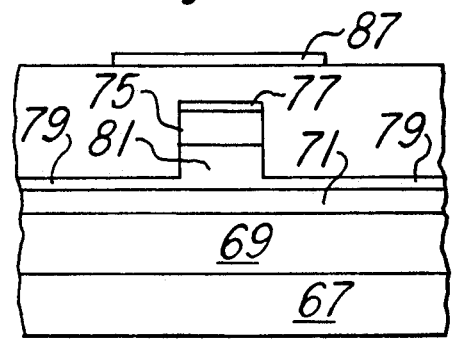

Referring now to FIGS. 4a to 4g, and first to 4a, the material structure of FIGS. 1a, 2a, and 3a is shown. As previously described, the structure comprises a subcollector layer 67, a collector layer 69, a base layer 71, an emitter layer 73, and an emitter cap layer 75. The deposition of emitter metal 77 and the formation of the ledge 79 and mesa 81 portions of the emitter also proceed as described previously, as shown in FIG. 4b. A layer of polyimide 83 is spun to cover the entire structure. Photoresist 85 is then patterned to leave an opening to the polyimide 83 in the dimensions of the desired passivation ledge, as shown in FIG. 4c. A masking metal 87 is then deposited on the polyimide layer 83 and photoresist 85 and any excess metal is removed. This results in the structure shown in FIG. 4d.

Figure 4E:
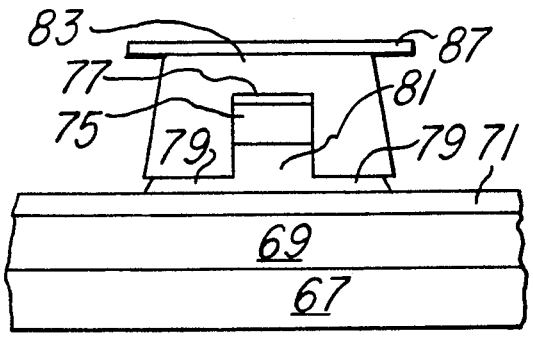
Figure 4F:
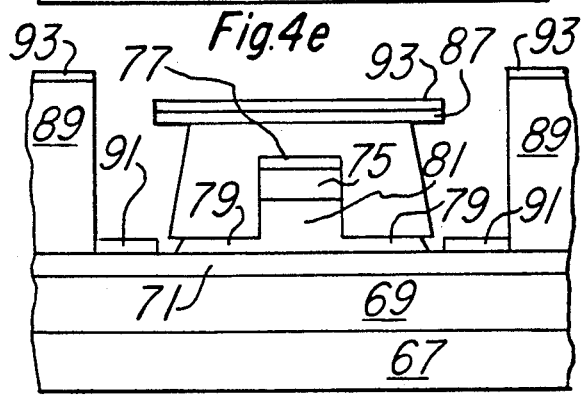
Figure 4G:
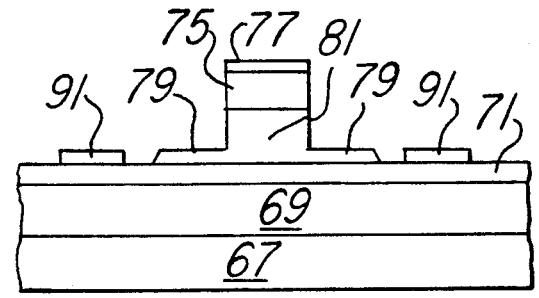

The portions of the polyimide layer 83 and the ledge 79 not covered by masking metal 87 are removed in separate etch processes. This etch results in undercuts at both the polyimide-metal interface and the ledge-polyimide interface as shown in FIG. 4e. A photoresist layer is then applied and patterned, and then evaporated metallization forms base contacts 91 as shown in FIG. 4f. The photoresist 89 and polyimide 83 are then removed along with excess metallization 93. This results in the structure shown in FIG. 4g, where the spacing between the base contacts 91 and the ledge 79 is determined by the undercut profile of the polyimide 83 and the ledge 79.

Referring now to FIGS. 5a to 5g, and first to 5a, the material structure of FIGS. 1a, 2a, 3a, and 4a is shown. As previously described, the structure comprises a subcollector layer 95, a collector layer 97, a base layer 99, an emitter layer 101, and an emitter cap layer 103. The deposition of emitter metal 105 and the formation of the ledge 107 and mesa 109 portions of the emitter also proceed as described previously, as shown in FIG. 5b.

It is now necessary to provide regions on the base layer 99 for contact thereto. This is accomplished by placing a patterned resist layer 109 over the mesa portion of the emitter 101 and part of the thin portion of the emitter 107, leaving a part of the thin portion 107 exposed. The exposed portion of the thin portion of the emitter 107 is now etched away in standard manner to reach the base layer 99 as shown in FIG. 5c. In this embodiment, the ledge is larger than in previously described embodiments and covers the desired location of the base contacts.

A photoresist layer 111 is patterned over the emitter mesa and ledge 107 to leave openings above the desired locations of the base contacts as shown in FIG. 5d. The portion of the ledge 107 exposed in the openings of the photoresist is then etched away as shown in FIG. 5e. Base contact metal 113 is then deposited to form the contact to the base layer 99 as shown in FIG. 5f. Photoresist 111 is removed, along with the excess metallization 113 to leave the structure shown in FIG. 5g. FIG. 6 is a top view showing the relative size and position of the emitter mesa 115 and the base contacts 117 as compared to the ledge pattern 119.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of making a heterojunction bipolar transistor comprising the steps of:
    (a) providing a structure having a collector layer, a base layer and an emitter layer, one atop the other;
    (b) forming a contact on said emitter layer;
    (c) removing a portion of said emitter layer to leave a mesa region having a first thickness with said contact thereon and a surrounding thin ledge region having a second thickness, said first thickness being thicker than said second thickness;
    (d) covering said mesa region and a portion of said ledge region with a protective layer, wherein said protective layer is thicker than said first thickness, and removing said ledge region from areas not covered by said protective layer to expose a portion of said base layer; and
    (e) forming a base contact on said exposed portion of said base layer, wherein an edge of said base contact is defined by an edge of said protective layer.

2. The method of claim 1 wherein said emitter layer is a group III-V compound and the junction of said emitter layer and said base layer is a heterojunction.

3. The method of claim 1 wherein said protective layer is photoresist.

4. The method of claim 1 wherein said protective layer is polyimide.

5. The method of claim 1 wherein said emitter layer is a ternary compound.

6. The method of claim 1 wherein said base contact is within a boundary of said ledge region.

7. The method of claim 1 wherein said second thickness is between approximately 200 and 1000 Angstroms and said first thickness is between approximately 500 and 4000 Angstroms.

8. The method of claim 6 wherein said emitter layer is a ternary compound.

9. The method of claim 8 wherein said ternary compound is GaInP.

10. The method of claim 9 wherein said ternary compound is $Ga_{0.5}In_{0.5}P$.

11. The method of claim 9 wherein said ternary compound is $Ga_xIn_{1-x}P$, wherein x is the range of approximately 0.50 to 0.52.

12. A method of making a heterojunction bipolar transistor comprising the steps of:
(a) providing a structure having a collector layer, a base layer and an emitter layer, one atop the other;
(b) forming a contact on said emitter layer;
(c) removing a portion of said emitter layer to leave a mesa region having a first thickness with said contact thereon and a surrounding thin ledge region having a second thickness, said first thickness being thicker than said second thickness;
(d) covering said mesa region and a portion of said ledge region with a first protective layer, wherein said first protective layer is thicker than said first thickness, and removing said ledge region from areas not covered by said first protective layer to expose a portion of said base layer;
(e) covering a portion of said first protective layer and a portion of said base layer with a second protective layer, wherein a first edge of said first protective layer and a first contact portion of said base layer adjacent said first edge are left exposed;
(f) forming a base contact on said first base contact portion of said base layer;
(g) removing said second protective layer;
(h) covering a portion of said first protective layer and a portion of said base layer with a third protective layer, wherein a second edge of said first protective layer and a second contact portion of said base layer adjacent said second edge is left exposed; and
(i) forming a base contact on said second base contact portion of said base layer.

13. The method of claim 12 wherein said first protective layer is photoresist, and wherein said photoresist is hardened by baking.

14. The method of claim 12 wherein said steps of forming said base contacts are performed by evaporation, and wherein said evaporation is performed at an angle, whereby said base contacts are spaced from said ledge region.

15. The method of claim 12 wherein said emitter layer is GaLnP.

16. The method of claim 14 wherein said angle is between approximately 15 and 30 degrees from the perpendicular.

17. A method of making a heterojunction bipolar transistor comprising the steps of:
(a) providing a structure having a collector layer, a base layer and an emitter layer, one atop the other;
(b) forming a contact on said emitter layer;
(c) removing a portion of said emitter layer to leave a mesa region having a first thickness with said contact thereon and a surrounding thin ledge region having a second thickness, said first thickness being thicker than said second thickness;
(d) covering said mesa region and said ledge region with a first protective layer, wherein said first protective layer is thicker than said first thickness;
(e) covering a portion of said first protective layer with a second protective layer, wherein a ledge boundary, said boundary including said mesa and a region around said mesa, is not covered by said second protective layer;
(f) forming a mask on said first protective layer in said ledge boundary;
(g) removing said second protective layer;
(h) removing said first protective layer and said ledge region from areas not covered by said mask to expose said base layer, wherein said first protective layer and said ledge region are undercut from said mask; and
(i) forming base contacts to said base layer, wherein said base contacts are spaced from said ledge region by said undercut of said mask.

18. The method of claim 17 wherein said first protective layer is polyimide.

19. The method of claim 17 wherein said mask is metal.

20. The method of claim 17 wherein said emitter layer is GaInP.

* * * * *